United States Patent
Song et al.

(10) Patent No.: US 9,401,707 B1
(45) Date of Patent: Jul. 26, 2016

(54) PUSH-PULL VOLTAGE DRIVER WITH LOW STATIC CURRENT VARIATION

(71) Applicant: QUALCOMM Incorporated, San Diego, CA (US)

(72) Inventors: Yu Song, San Diego, CA (US); Liang Dai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/675,936

(22) Filed: Apr. 1, 2015

(51) Int. Cl.
*H03K 17/16* (2006.01)
(52) U.S. Cl.
CPC .................................. *H03K 17/165* (2013.01)
(58) Field of Classification Search
CPC combination set(s) only.
See application file for complete search history.

(56) References Cited

U.S. PATENT DOCUMENTS

| | | | |
|---|---|---|---|
| 4,954,769 A | 9/1990 | Kalthoff | |
| 5,585,763 A | 12/1996 | Navabi et al. | |
| 5,783,934 A | 7/1998 | Tran | |
| 6,150,853 A | 11/2000 | Chrappan et al. | |
| 6,960,907 B2 * | 11/2005 | Poss | G05F 1/575 323/273 |
| 7,019,580 B1 | 3/2006 | Michalski | |
| 7,271,663 B2 | 9/2007 | Baum et al. | |
| 7,639,081 B2 | 12/2009 | Arakali et al. | |
| 2005/0024143 A1 | 2/2005 | Humphrey | |
| 2014/0132348 A1 | 5/2014 | Itabashi et al. | |

FOREIGN PATENT DOCUMENTS

| | | |
|---|---|---|
| EP | 0509113 A1 | 10/1992 |
| EP | 2790400 A1 | 10/2014 |
| WO | WO-9120125 A1 | 12/1991 |

OTHER PUBLICATIONS

International Search Report and Written Opinion—PCT/US2016/020270—ISA/EPO—May 24, 2016.

* cited by examiner

*Primary Examiner* — An Luu
(74) *Attorney, Agent, or Firm* — Haynes and Boone, LLP

(57) ABSTRACT

A push-pull driver is provided with a differential amplifier that amplifies a difference between an input voltage and an output voltage to drive a bias node coupled to a diode-connected bias transistor. The push-pull driver is configured to control the drain-to-source voltage for a source-follower output transistor having its gate tied to a gate for the diode-connected bias transistor to be proportional to the drain-to-source voltage for the diode-connected bias transistor. This proportionality prevents excessive static current variation that would otherwise be present in the source-follower output transistor.

20 Claims, 4 Drawing Sheets

PUSH-PULL VOLTAGE DRIVER WITH LOW STATIC CURRENT VARIATION

TECHNICAL FIELD

This application relates to voltage drivers, and more particularly to a push-pull driver having reduced static current variation.

BACKGROUND

A circuit having a relatively high output impedance will be excessively loaded if it drives a circuit having a relatively low input impedance. To circumvent this problem, it is conventional to isolate the low input impedance through a voltage buffer or driver. The voltage driver typically includes a differential amplifier that has a relatively high input impedance so that the high-output-impedance circuit can readily drive the voltage driver without excessive loading. Through negative feedback from the driver output to the differential amplifier, the voltage driver then maintains an output node voltage equaling (or proportional to) the driver input node voltage despite the diverse impedances. One common form of a voltage buffer or driver is a push-pull driver 100 shown in FIG. 1. An NMOS source-follower output transistor M2 and a PMOS source-follower output transistor P2 provide a low output impedance at their sources, which also comprise a driver output node 120. In contrast, a push-pull driver input node 125 has a high input impedance as it couples to the positive input of a differential amplifier 105. Output node 120 couples back to the negative input of differential amplifier 105 to set up the desired negative feedback. Differential amplifier 105 drives the sources of an NMOS diode-connected bias transistor M1 and a PMOS diode-connected bias transistor P1.

A current source 115 drives the drain of diode-connected bias transistor M1. Similarly, a current source 110 biases the drain of diode-connected bias transistor P1. Suppose that an output voltage (Vout) on output node 120 has drifted lower than an input voltage (Vref_in) on input node 125. The negative feedback through differential amplifier 105 will then increase the source voltage for diode-connected bias transistor M1, which in turn causes its drain voltage to increase. This increased drain voltage drives source-follower output transistor M2 to source more charge to output node 120 (the push in the push-pull configuration) to restore the output voltage Vout to equal the input voltage Vref_in. Conversely, if the output voltage Vout rises higher than the input voltage Vref_in, differential amplifier 105 will lower the source voltage for diode-connected bias transistor P1, which in turn causes its drain voltage to decrease. This decreased drain voltage causes source-follower output transistor P2 to conduct more current, withdrawing charge from output node 120 (the pull in a push-pull configuration). In this fashion, the output voltage Vout follows the input voltage Vref_in despite the divergent impedances.

Although push-pull driver 100 advantageously maintains the output voltage Vout at the desired value despite the different impedances, it presents some design problems with regard to satisfying all process corners. For example, note that the drain-to-source voltage (Vds) for diode-connected bias transistor M1 is its threshold voltage (Vt) as well as its gate-to-source voltage (Vgs). This drain-to-source voltage is in turn controlled by the bias current from current source 115. But the drain-to-source voltage Vds for corresponding source-follower output transistor M2 is the power supply voltage VDD minus the output voltage Vout. Because of this mismatch between their drain-to-source voltages, there is a wide static current variation across the various process corners for source-follower output transistor M2 as compared to diode-connected bias transistor M1 due to, for example channel-length modulation effects. A similar mismatch exists between diode-connected bias transistor P1 and source-follower output transistor P2.

This mismatch is plainly undesirable as one must design for the worst-case process corner. For example, suppose that one designs for a current of I conducted by the source-follower output transistors at the worst-case process corner. At another process corner, these same transistors may conduct a current of 2I, which then wastes power. Accordingly, there is a need in the art for improved push-pull buffers with reduced static current variation.

SUMMARY

A push-pull driver is provided with a differential amplifier that amplifies a difference between an input voltage and an output voltage and drives a bias node with a resulting amplified voltage. A pair of diode-connected bias transistors couple together through the bias node and are biased by corresponding current sources. The push-pull driver also includes a pair of source-follower output transistors having a common terminal for producing the output voltage. The pair of source-follower output transistors correspond to the pair of diode-connected bias transistors such that each source-follower output transistor has its gate coupled to the gate of the corresponding diode-connected bias transistor. Responsive to the current from the current sources, each diode-connected bias transistor will have a corresponding drain-to-source voltage. The push-pull driver is configured such that each source-follower output transistor has a drain-to-source voltage that is proportional to the drain-to-source voltage in the corresponding diode-connected bias transistor. This is quite advantageous because the source-follower output transistors thus have a reduced static current variation with regard to process corner variations as compared to prior art approaches.

BRIEF DESCRIPTION OF THE DRAWINGS

Embodiments of the disclosure and their advantages are best understood by referring to the detailed description that follows. It should be appreciated that like reference numerals are used to identify like elements illustrated in one or more of the figures.

DETAILED DESCRIPTION

A push-pull driver is provided in which each of its source-follower output transistors has a drain-to-source voltage that is proportional to the drain-to-source voltage for a corresponding diode-connected biasing transistor. In that regard, the push-pull driver includes an NMOS diode-connected bias transistor whose gate voltage biases the gate of a corresponding NMOS source-follower output transistor. The drain-tosource voltages for the NMOS diode-connected bias transistor and the corresponding NMOS source-follower output transistor are proportional. In one embodiment, this proportionality may be one-to-one such that the drain-to-source voltages are equal. In general, the proportionality depends upon the sizes of the transistors used in the push-pull driver. Similarly, the push-pull driver includes a PMOS diode-connected bias transistor whose gate voltage biases the gate of a corresponding PMOS source-follower output transistor. The drain-to-source voltages for the PMOS diode-connected bias transistor and the corresponding PMOS source-follower output transistor are controlled to be proportional.

A differential amplifier drives the sources of the diode-connected bias transistors, which are connected in series. The source-follower output transistors are also coupled in series. The drains for the source-follower output transistors form a push-pull driver output node that is tied to a negative input node of the differential amplifier to form a negative feedback loop. The input voltage for the push-pull driver drives a positive input node for the differential amplifier. In this fashion, an output voltage on the output node will follow the input voltage, as is conventional for a push-pull driver. However, unlike conventional push-pull drivers, the disclosed push-pull driver herein has sharply reduced current variation across the process corners due to the matching of the source-to-drain voltages. These and additional advantageous properties may be better appreciated with reference to the following example embodiments.

Figure 1:
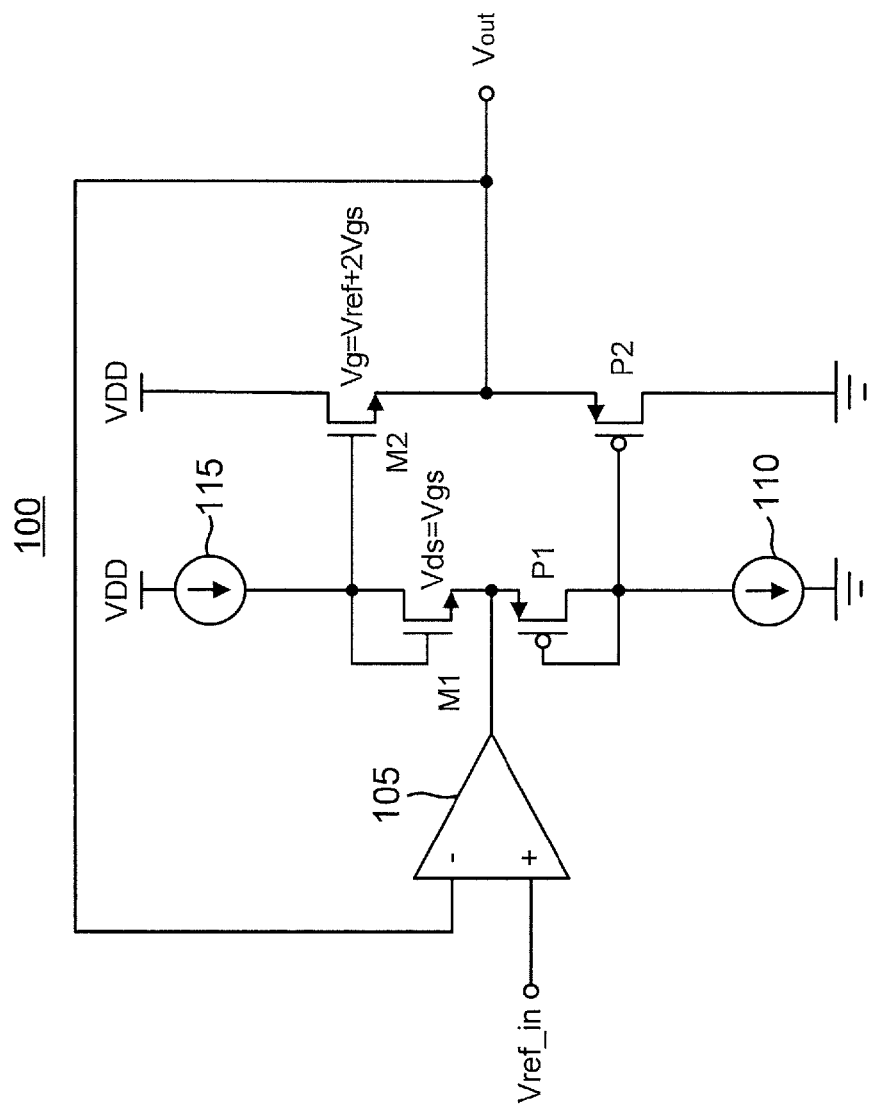
FIG. 1 is a circuit diagram of a conventional push-pull driver.
Figure 2:
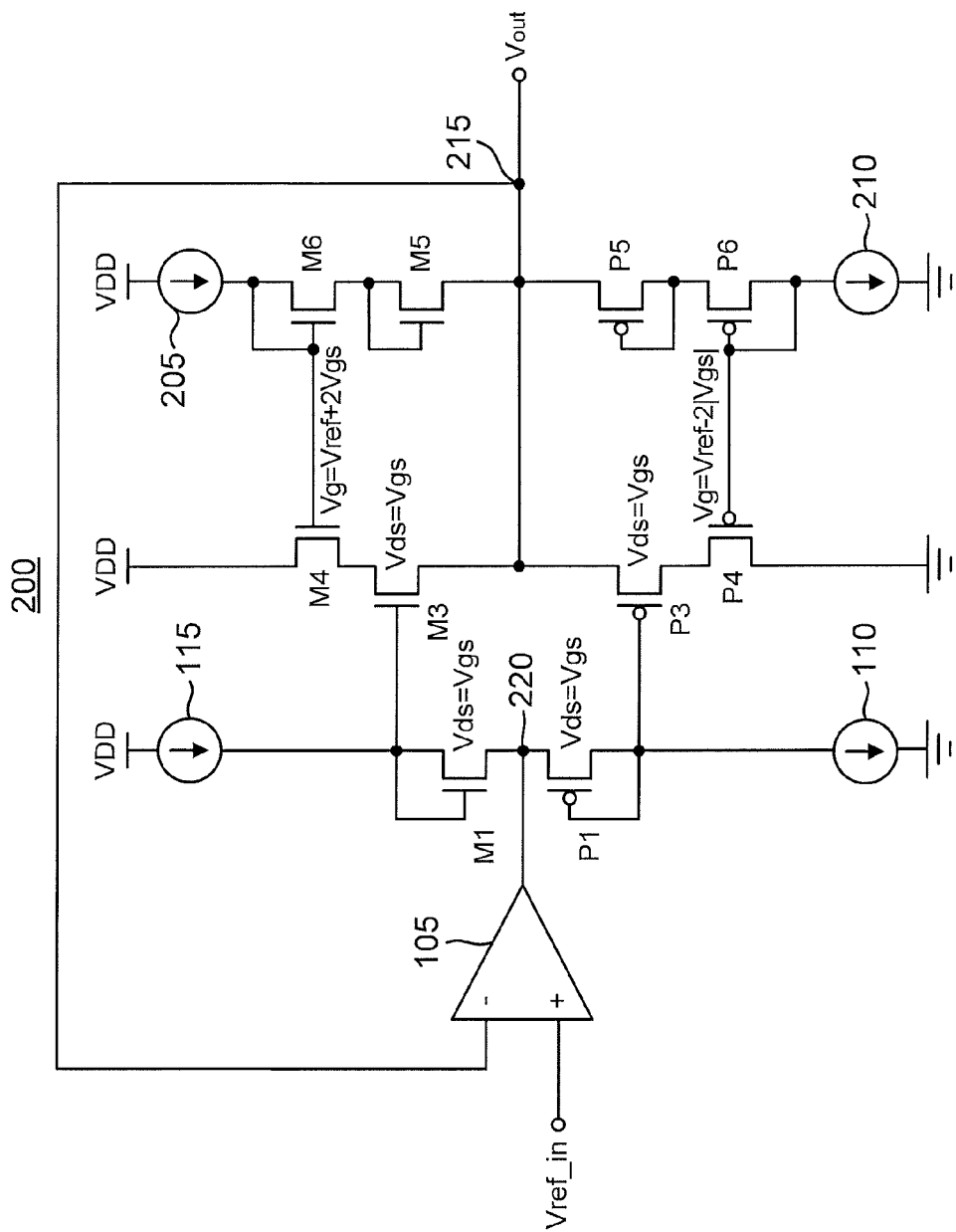
FIG. 2 is a circuit diagram of a push-pull driver including four diode-connected transistors in an output stage in accordance with an embodiment of the disclosure.

An example push-pull driver 200 having reduced static current variation as a function of process corner variation is shown in FIG. 2. As discussed with regard to conventional push-pull driver 100, NMOS diode-connected bias transistor M1 has its source coupled to the source for the PMOS diode-connected bias transistor P1. The differential amplifier 105 drives a voltage of a bias node 220 at the sources of diode-connected bias transistors P1 and M1 responsive to amplifying difference between an input voltage Vref_in and an output voltage Vout at an output node 215. Current source 115 biases the drain of diode-connected bias transistor M1. Similarly, current source 110 biases the drain of diode-connected bias transistor P1.

Suppose that the output voltage Vout is lower than the input voltage Vref_in. Differential amplifier 105 will then raise the source voltage of diode-connected bias transistor M1, which in turn raises its drain/gate voltage. This elevated gate voltage drives the gate of corresponding NMOS source-follower output transistor M3. The resulting elevated gate voltage on source-follower transistor M3 causes it to discharge to its drain, which is coupled to output node 215. Thus, the output voltage Vout is driven higher, which is the "push" in a push-pull driver architecture. Conversely, if the output voltage Vout is higher than the input voltage Vref_in, differential amplifier 105 will reduce the voltage at the source of diode-connected transistor P1. In turn, this reduced source voltage causes the gate/drain voltage for diode-connected transistor P1 to drop, which causes source-follower output transistor P3 to conduct more charge from output node 215 to its drain. This lowers the output voltage Vout and corresponds to the "pull" in a push-pull driver architecture.

To align the drain-to-source voltages for diode-connected bias transistor M1 with corresponding source-follower output transistor M3, an NMOS cascode transistor M4 couples between the drain of source-follower output transistor M3 and the power supply node. A serial pair of an NMOS diode-connected transistor M5 and an NMOS diode-connected transistor M6 creates a bias diode voltage for the gate of cascode transistor M4. In particular, a current source 205 biases the drain of diode-connected transistor M6. The source of diode-connected transistor M6 couples to the drain of diode-connected transistor M5, which in turn has its source coupled to output node 215. Diode-connected transistors M5 and M6 will each have a gate-to-source equaling their threshold voltage (Vt) due to their diode configurations. The gate voltage for cascode transistor M4 will thus equal Vout+2Vt. In turn, the source for cascode transistor M4 will be a threshold voltage below its gate voltage such that the source voltage for cascode transistor M4 will equal Vout+Vt. The drain-to-source voltage Vds for source-follower output transistor M3 thus equals (Vout+Vt) minus Vout, which equals Vt. Due to its diode configuration, the drain-to-source voltage Vds for diode-connected bias transistor M1 is also Vt. The current through source-follower output transistor M3 is thus well controlled as it will then be proportional (the proportionality depending upon the relative transistor sizes) to the current through diode-connected bias transistor M1. In this fashion, the problems of excessive static current variation across the various process corners discussed above with regard to conventional push-pull driver 100 are solved as the current through source-follower output transistor M3 is tightly controlled rather than being subject to channel-length modulation effects.

The drain-to-source voltage Vds for source-follower output transistor P3 is controlled analogously in that the drain of source-follower output transistor P3 couples to ground through a PMOS cascode transistor P4. A stack of two PMOS diode-connected transistors P5 and P6 couples between output node 215 and ground. Diode-connected transistor P5 has its source coupled to output node 215 and its drain coupled to a source of diode-connected transistor P6, which in turn has its drain coupled to ground through a current source 210. The gate/drain voltage for diode-connected transistor P6 will thus equal Vout−2Vt. Since the gate of diode-connected transistor P6 couples to the gate of cascode transistor P4, the source voltage for cascode transistor P4 then equals Vout−Vt. The drain-to-source voltage Vds for source-follower output transistor P3 will thus equal Vout−(Vout−Vt), which equals Vt. This is also the drain-to-source voltage for diode-connected bias transistor P1 due to its diode configuration. The drain-to-source voltage for source-follower output transistor P3 is thus tied to the drain-to-source voltage for diode-connected bias transistor P1, thereby limiting the static current variation with respect to process corners for source-follower output transistor P3. In addition, note that this control of the drain-to-source voltages for source-follower output transistors M3 and P3 is achieved using relatively little power as current sources 205 and 210 need merely drive the relatively small amount of current necessary to forward bias the stacked diode-connected transistors M6, M5, P5, and P6.

Figure 3:
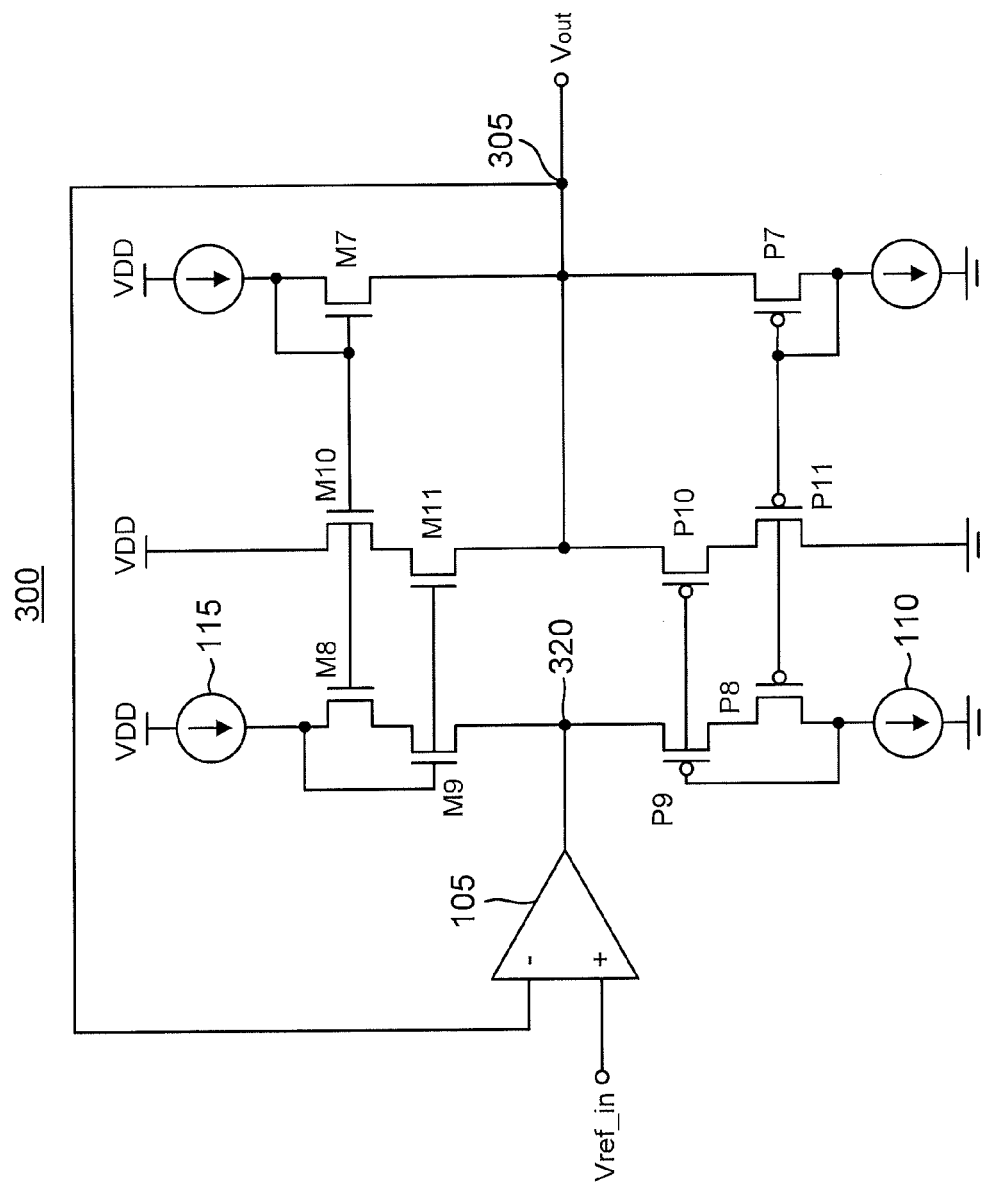
FIG. 3 is a circuit diagram of a push-pull driver requiring just two diode-connected transistors in an output stage in accordance with an embodiment of the disclosure.

An alternative embodiment is shown in FIG. 3 with regard to a push-pull driver 300. Like push-pull driver 200, push-pull driver 300 includes differential amplifier 105 that amplifies the difference between input voltage Vref_in and an output voltage Vout at an output node 305 to bias a bias node 320. An NMOS diode-connected bias transistor M9 has its source coupled to bias node 320. But its diode connection is indirect as a cascode transistor M8 intervenes between its drain and current source 115. The gate of diode-connected transistor M9 couples to the drain of cascode transistor M8 and also to the gate of an NMOS source-follower output transistor M11.

In push-pull driver 300, the two diode-connected transistors M5 and M6 of push-pull driver 200 are replaced by a single NMOS diode-connected transistor M7 having it source coupled to output node 305 and its drain coupled to a power supply node through a current source 310. Similarly, the two diode-connected transistors P5 and P6 discussed with regard to FIG. 2 are replaced by a single PMOS diode-connected transistor P7 having its source tied to output node 305 and its drain coupled to ground through a current source 315. The gate of diode-connected transistor M7 is a threshold voltage higher than the output voltage Vout. This gate voltage biases an NMOS cascode transistor M10 having its drain tied to the power supply node and its source tied to a drain of NMOS source-follower output transistor M11 that in turn has its source tied to output node 305. The drain-to-source voltage for source-follower output transistor M11 is thus not equal to the threshold voltage as was the case for source-follower output transistor M3 of push-pull driver 200. Instead, the drain-to-source for source-follower output transistor M11 will equal a difference between the threshold voltage drop across diode-connected transistor M7 as compared to the threshold voltage drop across cascode transistor M10.

If the drain of diode-connected bias transistor M9 were coupled to current source 115 analogous to the configuration for diode-connected bias transistor M1 of push-pull driver 200, the drain-to-source voltage for diode-connected bias transistor M9 would equal its threshold voltage, which is different from the drain-to-source voltage across corresponding source-follower output transistor M11. But the threshold voltage drop across cascode transistor M8 matches that of cascode transistor M10 since their gates are tied together. Because of the feedback through differential amplifier 105, the voltage of bias node 320 will substantially equal the output voltage Vout. The gate voltage of diode-connected bias transistor M9 will thus substantially equal the output voltage Vout plus its threshold voltage Vt. This gate voltage is also the drain voltage for cascode transistor M8 so that the source voltage for cascode transistor M8 will equal the output voltage Vout plus the difference between the threshold voltages for cascode transistor M8 and diode-connected bias transistor M9. This source voltage is also the drain voltage for diode-connected bias transistor M9 so that its drain-to-source voltage will equal the drain-to-source voltage for source-follower transistor M11 as both these voltages are the difference between the threshold voltages between a diode-connected transistor and a cascode transistor.

Figure 4:
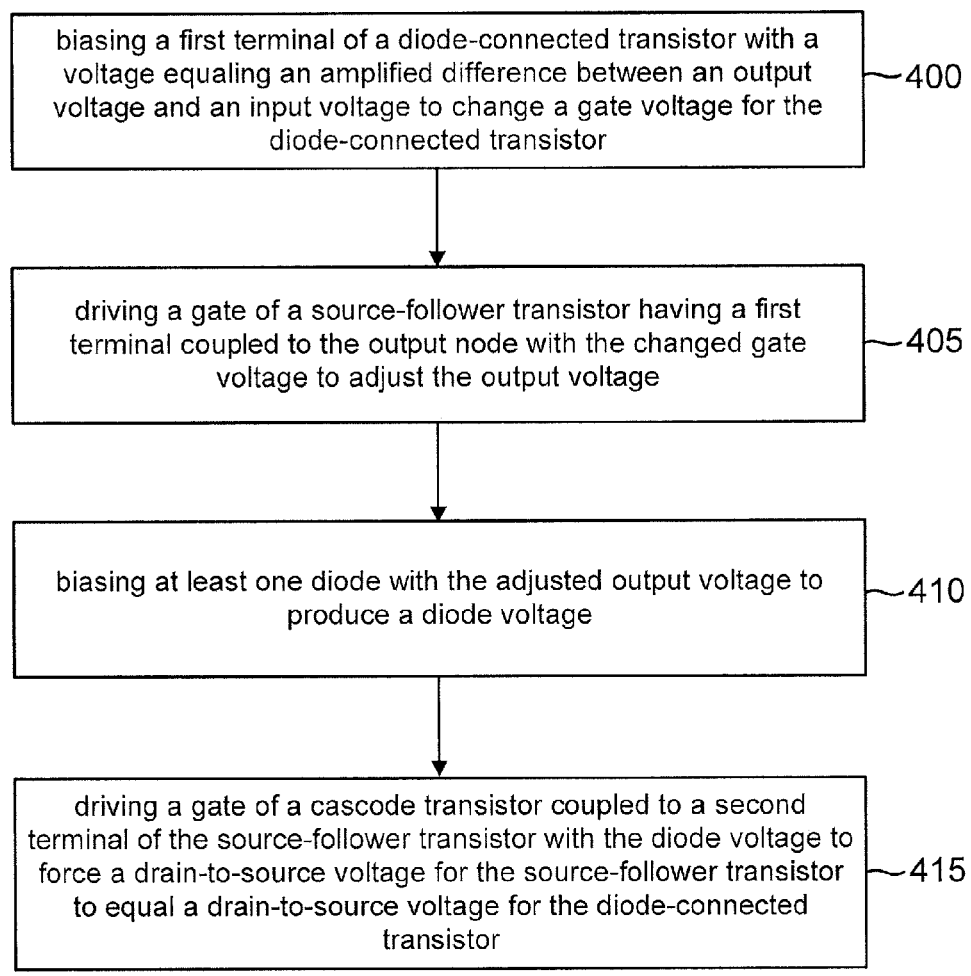
FIG. 4 is a flowchart for an example method of operation for a push-pull driver in accordance with an embodiment of the disclosure.

An analogous tie exists between the drain-to-source voltages for a PMOS diode-connected bias transistor P9 and a corresponding PMOS source-follower output transistor P10. A source of source-follower output transistor P10 couples to output node 305 whereas it drain couples to a source for a PMOS cascode transistor P11 that has its drain tied to ground. The gate of diode-connected transistor P7 couples to the gate of cascode transistor P11 so that the drain-to-source voltage across source-follower output transistor P10 equals the difference between the threshold voltage for diode-connected transistor P7 and the threshold voltage for cascode transistor P11. In turn, the drain-to-source voltage for diode-connected bias transistor P9 equals the difference between the threshold voltage for diode-connected bias transistor P9 and the threshold voltage for cascode transistor P8. The source-to-drain voltage for source-follower output transistor P10 is thus tied to the drain-to-source voltage for diode-connected bias transistor P9. In turn, the drain-to-source voltage Vds for diode-connected bias transistor P9 is controlled by current source 110. The resulting current-source-control of the drain-to-source voltage for source-follower output transistors M11 and P10 advantageously limits their static current variation across the process corners as compared to prior art push-pull architectures. An example method of operation for a push-pull driver will now be discussed A flowchart for an example method of operation for a push-pull driver in accordance with an embodiment of the disclosure is shown in FIG. 4. The method includes an act 400 of biasing a first terminal of a diode-connected bias transistor with a voltage equaling an amplified difference between an output voltage and an input voltage to bias a gate voltage for the first diode-connected bias transistor. The biasing of bias node 220 and 320 are examples of act 400. In addition, the method includes an act 405 of driving a gate of a source-follower output transistor having a first terminal coupled to the output node with the biased gate voltage to adjust the output voltage. The control of the gate voltage for source-follower output transistors M3 and M11 to control the output voltage Vout is an example of act 405. In addition, the method includes an act 410 of biasing at least one diode with the adjusted output voltage to produce a diode voltage. The biasing of diode-connected transistor M7 or diode-connected transistors M5 and M6 is an example of act 410. Finally, the method includes an act 415 of driving a gate of a cascode transistor coupled to a second terminal of the source-follower output transistor with the diode voltage. The driving of the gate voltage for cascode transistors M4 or M10 is an example of act 415.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:
1. A circuit, comprising:
  a differential amplifier configured to drive a bias node based on a comparison of an output voltage at an output node and an input voltage;
  a first diode-connected bias transistor having a first terminal coupled to the bias node;
  a first source-follower output transistor having a first terminal coupled to the output node and a gate coupled to a gate of the first diode-connected bias transistor;
  a first cascode transistor coupled to a second terminal of the first source-follower output transistor; and
  at least one first diode coupled to the output node, wherein the at least one first diode includes a terminal coupled to a gate of the first cascode transistor.
2. The circuit of claim 1, wherein the at least one first diode comprises a first diode-connected transistor having a first terminal coupled to the output node and a second diode-connected transistor having a first terminal coupled to a second terminal of the first diode-connected transistor, and wherein a gate of the second diode-connected transistor is coupled to the gate of the cascode transistor.
3. The circuit of claim 2, wherein the first diode-connected transistor, the second diode-connected transistor, and the cascode transistor are NMOS transistors.
4. The circuit of claim 2, wherein the first diode-connected transistor, the second diode-connected transistor, and the cascode transistor are PMOS transistors.
5. The circuit of claim 2, further comprising a current source configured to drive a bias current into a second terminal of the second diode-connected transistor.

6. The circuit of claim 1, further comprising:
a second diode-connected bias transistor having a terminal coupled to the bias node;
a second source-follower output transistor having a first terminal coupled to the output node and a gate coupled to a gate of the second diode-connected bias transistor;
a second cascode transistor coupled to a second terminal of the second source-follower output transistor;
at least one second diode coupled to the output node, wherein the at least one second diode includes a terminal coupled to a gate of the second cascode transistor.

7. The circuit of claim 1, further comprising:
a current source configured to drive a current into a second terminal of the first diode-connected bias transistor.

8. The circuit of claim 1, further comprising:
a current source; and
a second cascode transistor having a first terminal coupled to a second terminal of the first diode-connected bias transistor and a second terminal coupled to the current source, wherein a gate of the first diode-connected bias transistor couples to the second terminal of the second cascode transistor.

9. The circuit of claim 1, wherein the first diode-connected bias transistor, the first cascode transistor, and the first source-follower output transistor all comprise NMOS transistors.

10. The circuit of claim 1, wherein the first diode-connected bias transistor, the first cascode transistor, and the first source-follower output transistor all comprise PMOS transistors.

11. The circuit of claim 1, wherein the differential amplifier is configured to drive bias node so that the output voltage equals the input voltage.

12. The circuit of claim 1, wherein the first diode-connected bias transistor is configured to have a drain-to-source voltage that equals a drain-to-source voltage for the first source-follower output transistor.

13. The circuit of claim 1, wherein the first diode-connected transistor is configured to have a drain-to-source voltage that is proportional to a drain-to-source voltage for the first source-follower output transistor.

14. A method
biasing a first terminal of a diode-connected bias transistor with a voltage equaling an amplified difference between an output voltage and an input voltage to bias a gate voltage for the first diode-connected bias transistor;
driving a gate of a source-follower output transistor having a first terminal coupled to the output node with the biased gate voltage to adjust the output voltage;
biasing at least one diode with the adjusted output voltage to produce a diode voltage; and
driving a gate of a cascode transistor coupled to a second terminal of the source-follower output transistor with the diode voltage.

15. The method of claim 14, wherein biasing the at least one diode comprises biasing a pair of diode-connected transistors such that the diode voltage equals the output voltage plus twice a threshold voltage for each of the diode-connected transistors in the pair.

16. The method of claim 14, wherein biasing the at least one diode comprises biasing a single diode-connected transistor such that the diode voltage equals the output voltage plus a threshold voltage for the single diode-connected transistor.

17. The method of claim 14, further comprising driving a bias current into a second terminal of the diode-connected bias transistor.

18. A circuit, comprising:
a differential amplifier configured to drive a bias node based on a comparison of an output voltage at an output node and an input voltage;
a first diode-connected bias transistor having a source coupled to the bias node;
a first source-follower output transistor having a source terminal coupled to the output node and a gate coupled to a gate of the first diode-connected bias transistor; and
means for maintaining a drain-to-source voltage for the first source-follower output transistor to be proportional to a drain-to-source voltage for the first diode-connected bias transistor.

19. The circuit of claim 18, wherein the means is configured so that the drain-to-source voltage for the first source-follower transistor equals the drain-to-source voltage for the first diode-connected bias transistor.

20. The circuit of claim 18, further comprising:
a second diode-connected bias transistor having a source coupled to the bias node; and
a second source-follower output transistor having a source terminal coupled to the output node and a gate coupled to a gate of the second diode-connected bias transistor.

\* \* \* \* \*